(12) United States Patent
Schuler et al.

(10) Patent No.: US 7,541,637 B2
(45) Date of Patent: Jun. 2, 2009

(54) NON-VOLATILE SEMICONDUCTOR MEMORY ELEMENT AND CORRESPONDING PRODUCTION AND OPERATION METHOD

(75) Inventors: Franz Schuler, Poing (DE); Georg Tempel, Dresden (DE)

(73) Assignee: Infineon Technologies AG, Munich (DE)

( * ) Notice: Subject to any disclaimer, the term of this patent is extended or adjusted under 35 U.S.C. 154(b) by 373 days.

(21) Appl. No.: 10/524,158

(22) PCT Filed: Aug. 8, 2003

(86) PCT No.: PCT/DE03/02678

§ 371 (c)(1),
(2), (4) Date: Apr. 21, 2006

(87) PCT Pub. No.: WO2004/021448

PCT Pub. Date: Mar. 11, 2004

(65) Prior Publication Data

US 2006/0226466 A1    Oct. 12, 2006

(30) Foreign Application Priority Data

Aug. 23, 2002   (DE) .................. 102 38 784

(51) Int. Cl.
*H01L 29/788*   (2006.01)
*H01L 29/76*    (2006.01)

(52) U.S. Cl. ............. 257/315; 257/314; 257/E27.078; 257/E29.3; 257/E29.309; 438/201; 438/211; 438/257

(58) Field of Classification Search ......... 257/314–317, 257/298, E27.078, E29.3, E29.309, 319, 257/320, 322, 326, 390

See application file for complete search history.

(56) References Cited

U.S. PATENT DOCUMENTS

| 3,731,163 A | 5/1973 | Shuskus |
| 5,349,222 A | 9/1994 | Shimoji |
| 5,408,115 A | 4/1995 | Chang |

(Continued)

FOREIGN PATENT DOCUMENTS

EP        1 345 273 A1    9/2003

(Continued)

OTHER PUBLICATIONS

Japanese Office Action for Patent Application No. 2004-531667, Feb. 20, 2009.

*Primary Examiner*—Theresa T Doan
*Assistant Examiner*—Sarah K Salerno
(74) *Attorney, Agent, or Firm*—Brinks Hofer Gilson & Lione

(57) ABSTRACT

The invention relates to a nonvolatile semiconductor storage element and an associated production and control method, the storage element includes a semiconductor substrate having a source region, a drain region and an intermediate channel region. On a first portion of the channel region, a control layer is formed and insulated from the channel region by a first insulating layer whereas respective charge storage layers are formed in a second portion of the channel region and are insulated from the channel region by a second insulating layer. On the charge storage layer, a programming layer is formed and insulated from the charge storage layer by a third insulating layer and is electrically connected to a respective source region and drain region via a respective interconnect layer.

19 Claims, 5 Drawing Sheets

U.S. PATENT DOCUMENTS

| | | |
|---|---|---|
| 5,654,568 A | 8/1997 | Nakao |
| 5,930,631 A * | 7/1999 | Wang et al. .................. 438/286 |
| 5,969,383 A * | 10/1999 | Chang et al. ................. 257/316 |
| 6,178,113 B1 * | 1/2001 | Gonzalez et al. ....... 365/185.03 |
| 6,225,554 B1 * | 5/2001 | Trehan et al. ................ 174/371 |
| 6,249,022 B1 | 6/2001 | Lin et al. |
| 6,335,554 B1 | 1/2002 | Yoshikawa |
| 6,352,895 B1 | 3/2002 | Lam |
| 6,366,500 B1 | 4/2002 | Ogura et al. |
| 6,388,293 B1 | 5/2002 | Ogura et al. |
| 6,617,605 B2 * | 9/2003 | Winters ....................... 257/10 |
| 6,627,500 B1 * | 9/2003 | Liu et al. .................... 438/261 |
| 6,949,788 B2 * | 9/2005 | Fujiwara et al. ............. 257/314 |
| 7,456,465 B2 * | 11/2008 | Prinz et al. .................. 257/315 |
| 7,473,961 B2 * | 1/2009 | Kim et al. .................... 257/321 |
| 2002/0003255 A1 * | 1/2002 | Usuki et al. ................. 257/316 |
| 2002/0105023 A1 | 8/2002 | Kuo et al. |
| 2002/0105037 A1 | 8/2002 | Takahashi |
| 2003/0142550 A1 * | 7/2003 | Kawahara et al. ...... 365/185.28 |
| 2004/0072402 A1 * | 4/2004 | Inoue ......................... 438/267 |
| 2005/0236662 A1 * | 10/2005 | Lee ............................ 257/319 |
| 2006/0202284 A1 * | 9/2006 | Yuda .......................... 257/390 |

FOREIGN PATENT DOCUMENTS

| | | |
|---|---|---|
| JP | 5235369 A | 9/1993 |
| JP | 2001230332 A | 8/2001 |
| JP | 2002170891 A | 6/2002 |

* cited by examiner

NON-VOLATILE SEMICONDUCTOR MEMORY ELEMENT AND CORRESPONDING PRODUCTION AND OPERATION METHOD

TECHNICAL FIELD

The present invention relates to a nonvolatile semiconductor storage element and an associated production and control method and, in particular, to a nonvolatile dual-bit split-gate storage cell in which information is written in by means of charge carrier injection at the source.

BACKGROUND

Nonvolatile semiconductor memories which are known, for example, as FLASH memory, EPROM, EEPROM, FPGAs and the like, are becoming more and more successful in many fields such as, e.g. dataprocessing, telecommunications, entertainment, electronics and security technology since they can store data in a very small space over a long period and without using a supply voltage.

In this connection, there is a multiplicity of different storage element types, the present invention relating to, in particular, a so-called split-gate storage cell.

FIG. 1 shows a simplified sectional view of such a conventional split-gate storage element.

According to FIG. 1, a channel region located in a semiconductor substrate 1 between a source region S and a drain region D is split into a first part-section I and a second part-section II, a control layer 5 being formed directly above the channel region and being separated from this by a first insulating layer 2A in the first part-section whereas it is located only indirectly above the channel region or semiconductor substrate 1, respectively, in a second part-section II. To achieve the desired charge-storing characteristics, instead, a charge storage layer 3 is formed above the channel region or semiconductor substrate 1, respectively, and insulated from the latter by a second insulating layer or tunnel layer 2B in the second part-section II.

To implement a so-called source side charge carrier injection (SSI—source side injection), the split-gate storage element according to FIG. 1 also has a programming layer 6 which is essentially formed on the surface of the charge storage layer 3 and separated or insulated from the latter by a third insulating layer 4.

For programming or injecting charge carriers into the charge storage layer 3, a programming electrode PG connected to the programming layer 6, a control electrode CG connected to the control layer 5, a source line SL connected to the source region S and a bit line BL connected to the drain region D are connected in such a manner that at the transition between the first and second part-section I and II, an electrical field is built up in the channel area which is of such an amplitude that, due to the high potential gradient present, electrons coming from the source region S are accelerated in such a manner that they are injected in to the charge storage layer. Such programming under SSI (source side injection) conditions extends the life of storage elements due to the reduced stress on the insulating layers compared with the excessive electrical fields required for a drain-side charge carrier injection. In addition, programming under SSI conditions is much more efficient than a drain-side charge carrier injection as a result of which, in particular, the time required for such programming is reduced or, with the same programming time, the channel current and thus the power consumption can be reduced. In particular, however, the operating voltages can be significantly reduced in the case of storage elements with source side charge carrier injection.

A disadvantageous factor in such storage elements with source side charge carrier injection is, however, too much greater design expenditure resulting, in particular, from the three separate control layers—charge storage layer 3, programming layer 6 and control layer 5. It is particularly due to the additional programming layer 6 and a lack of self-adjustment that high integration densities can only be implemented to a limited extent for such split-gate storage elements.

FIG. 2 shows a simplified sectional view of a further nonvolatile storage element, where essentially a so-called CHE (channel hot electron) charge carrier injection takes place at the drain by means of hot charge carriers from the channel.

According to FIG. 2, such a nonvolatile storage element consists of a semiconductor substrate 1 in which a source region S, a drain region D and an intermediate channel region are formed, a charged storage layer 3 being formed by a first insulating layer 2 on the channel region, separated from the latter, and again being suitable for storing charge carriers. On the surface of the charge storage layer 3 is again a control layer 5 which is separated from the charge storage layer 3 by a further insulating layer 4.

In contrast to the split-gate storage cell with source-side charge carrier injection, described above, this nonvolatile storage cell only needs three contact connections, namely a control electrode CG or wordline WL to connect the control layer 5 and a source line SL for connecting the source region S and a bitline BL for connecting the drain region. As a result, the structure and thus also the production of such a conventional storage cell is considerably simplified and an increased density of integration can be achieved particularly due to the lack of a contact connection for a programming layer.

A disadvantageous factor in such a nonvolatile storage cell is, however, the use of necessary and high operating voltages in order to achieve a CHE (channel hot electron) channel injection by means of hot charge carriers. In particular, these high drain and gate voltages are the result of the effort to shorten the programming time which is why programming essentially takes place in the vicinity of the breakdown voltages. In consequence, such high voltages for implementing a charge carrier injection under CHE conditions need additional voltage supply circuits and an extremely high stress on the insulating layers provided.

FIG. 3 shows a simplified sectional view of a further conventional nonvolatile semiconductor storage element for storing two bits such as is known, for example, from the printed document U.S. Pat. No. 6,366,500.

According to FIG. 3, a source region S and a drain region D with an intermediate channel region is again formed in a semiconductor substrate 1, which channel region exhibits a first part-section I and two second part-sections IIA and IIB at the source and at the drain. On the surface of the semiconductor substrate 1 or the channel region, respectively, there is again a first insulating layer as gate dielectric or as tunnel dielectric, a control layer 5 being formed on the surface of the first insulating layer 2 in the first part section I and a drain side charge storage layer 3A and a source side charge storage layer 3B, which have doped polysilicon as electrically conductive floating gates, being formed in each case in the two second part-sections IIA and IIB of the channel region.

To implement the abovementioned source side charge carrier injection or SSI condition, respective drainside and source side programming layers 6A and 6B, which are insulated or separated from the respective charge storage layers 3A and 3B by a further insulating layer 4A and 4B, are located at the charge storage layers 3A and 3B.

Although this provides a so-called dual-bit split-gate storage cell with source side charge injection, the complexity and space requirement are again increased due to the programming layers 6A and 6B used.

FIG. 4 shows a simplified sectional view of a further conventional dual-bit split-gate storage cell, where identical reference symbols again describe identical or corresponding elements as in FIGS. 1 to 3 and a repeated description is omitted in the text which follows.

According to FIG. 4, it is again possible to store two storage states, i.e. two bits, at the source and at the drain in a charge storage layer 3A and 3B, but such a storage element uses an electrically nonconductive silicon nitride layer as the charge storage layer. Such a split-gate storage element as is known, for example, from the printed document U.S. Pat. No. 5,408,115, again results in advantageous or low programming voltages due to the adjustable SSI condition, in which case the complexity and the space required for achieving such a storage element are again very high.

BRIEF SUMMARY

The invention is, therefore, based on the object of creating a nonvolatile semiconductor storage element and an associated production and control method by means of which a simplified structure can be achieved with advantageous programming conditions.

According to the invention, this object is achieved by the features of claim 1 with regard to the split-gate storage element, by the measures of claim 7 with regard to the production method and by the measures of claims 16 to 18 with regard to the control method.

It is particularly due to the use of an interconnect layer for electrically connecting the programme layer to the source region or drain region that a much simpler structure with much less space requirement is obtained, the operating voltages still being low due to source side charge carrier injection.

A charge storage layer preferably consists of an electrically nonconductive insulating layer such as, e.g. an $Si_3N_4$ or $ZrO_2$ layer which provides a further increase in the integration density.

A second part section of the channel region is preferably divided into a source side and drain side part section and a charge storage layer, a programming layer and an interconnect layer also being divided into a source side and drain side charge storage layer, programming layer, and interconnect layer in the same manner as a result of which a so-called dual-bit split-gate storage cell can be implemented in a simple manner.

With regard to the method, a dual-bit split-gate storage element can be produced in a particularly simple and inexpensive manner by forming a sequence of layers consisting of a second insulating layer, a charge storage layer and a third insulating layer on the surface of a semiconductor substrate and of a patterned control layer and a subsequent spacer method for forming and patterning respective programming layers.

With regard to the control method, corresponding write voltages are applied to the source side and drain side interconnect layers and the control layer for implementing the writing of information into the storage cell for generating an SSI (source side injection) condition which is why low write operating voltages can be achieved.

On the other hand, to erase information, erase voltages can be applied to the drain side interconnect layer and to the control layer which are such that an avalanche effect condition results in the channel and relatively low operating voltages are again required.

To read out an information item, corresponding read voltages are applied to the source side and drain side interconnect layers and to the control layer in such a manner that a so-called reverse readout condition is preferably obtained in the storage element.

In this manner, all necessary control conditions can be created for the split-gate storage cell according to the invention in spite of a lack of separate connections for the respective programming layers.

BRIEF DESCRIPTION OF THE DRAWING

Further advantageous embodiments of the invention are characterized in the subclaims.

In the text which follows, the invention will be described in greater detail by means of an illustrative embodiment and referring to the drawing, in which.

DETAILED DESCRIPTION

In the text which follows, the invention will be described by means of a dual-bit split-gate storage element for storing two memory states in a source side and drain side area but, in principle, corresponding nonvolatile semiconductor storage elements for storing only a single state are also conceivable. In particular, it should be pointed out that due to the symmetry of the storage element shown in the figures, the source region and the drain region can be considered as being equivalent and, in consequence, are also correspondingly interchangeable. In particular, this also applies to the source side and drain side layers, where only the respective connection potentials need to be exchanged.

Figure 1:
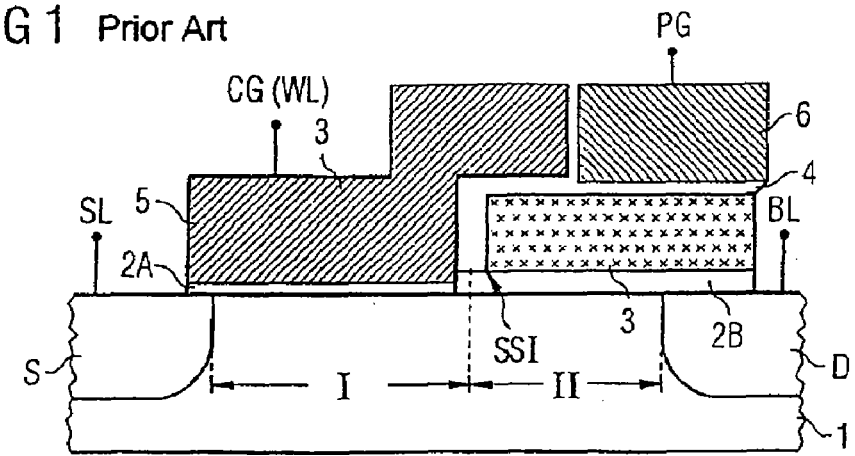
FIG. 1 shows a simplified sectional view of a split-gate storage element according to the prior art.
Figure 2:
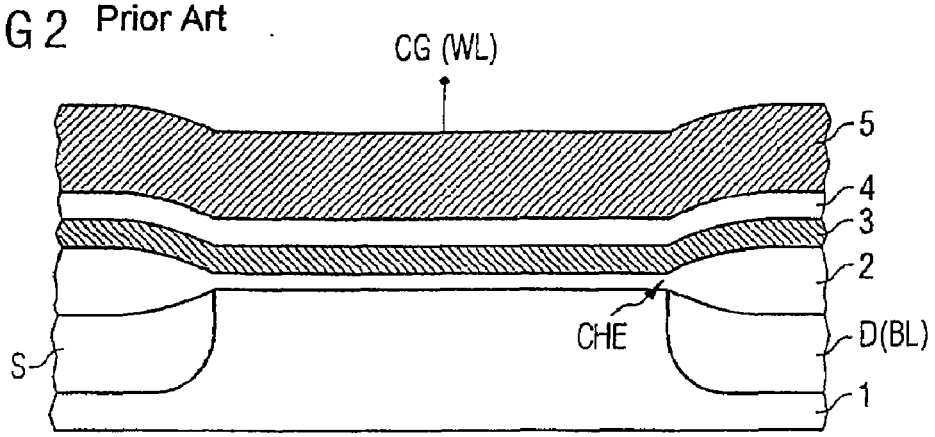
FIG. 2 shows a simplified sectional view of a nonvolatile storage element according to the prior art.
Figure 3:
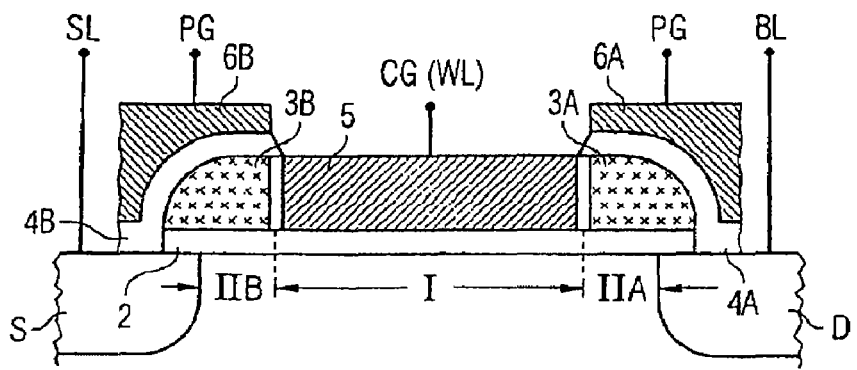
FIG. 3 shows a simplified sectional view of a dual-bit split-gate storage element according to the prior art.
Figure 4:
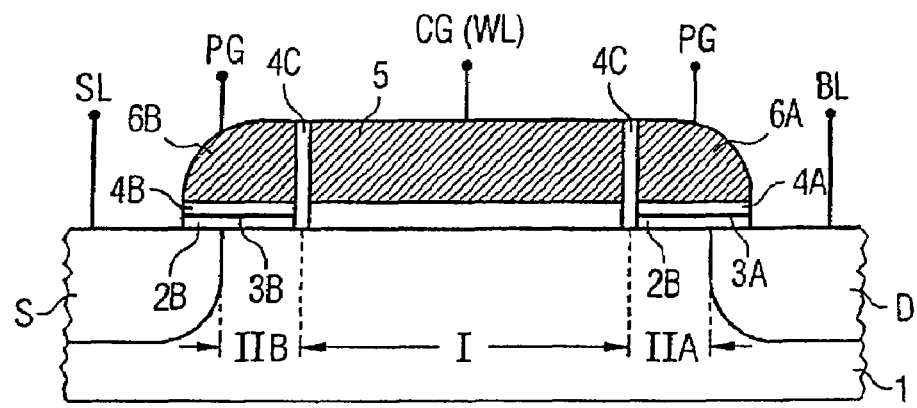
FIG. 4 shows a simplified sectional view of a further dual-bit split-gate storage element according to the prior art.
Figure 5:
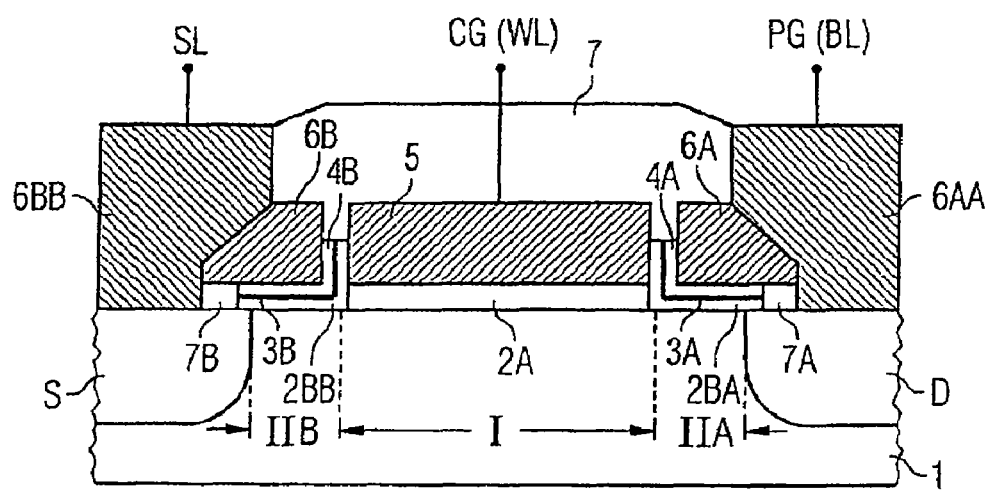
FIG. 5 shows a simplified sectional view of a dual-bit split-gate storage element according to the invention.

FIG. 5 shows a simplified sectional view of a dual-bit split-gate storage element according to the invention, identical reference symbols representing identical or corresponding layers and elements as in FIGS. 1 to 4 and a repeated description being omitted in the text which follows.

According to FIG. 5, a source region S, a drain region D and an intermediate channel region are formed in a semiconductor substrate 1 which preferably has a silicon semiconductor substrate, this structure corresponding, for example, to a PMOS or NMOS transistor structure and having corresponding p- and n-type dopings. To achieve a so-called split gate area, the channel region has a first part-section I which is essentially located in a central area of the channel region, and two second part-sections IIA and IIB which adjoin the first part-section I in drain side and source side areas of the channel region and extend to the source region S and drain region D.

According to FIG. 5, an electrically conductive control layer 5 which is insulated from the channel region by a first insulating layer 2A is formed on the first part-section I of the channel region. The control layer 5 consists, for example, of a highly doped polysilicon layer, the first insulating layer 2A representing a gate dielectric and preferably exhibiting $SiO_2$. On the two second part-sections IIA and IIB of the channel region, on the other hand, a drain side and source side charge storage layer 3A and 3B which is separated or insulated from the channel region by a second insulating layer 2BA and 2BB is located in each case and the second insulating layer 2BA and 2BB can also be identical with the first insulating layer 2.

The charge storage layers preferably consist of an electrically nonconductive insulating layer such as, e.g. a silicon nitride layer, which results in small layer thicknesses and advantageous charge retaining characteristics and insulating characteristics, respectively. In principle, however, other insulating layers such as, for example, $ZrO_2$, $HFO_2$ or also conventional electrically conductive floating-gate layers can be used as charge storage layers 3A and 3B.

In the area of the drain side and source side charge storage layers 3A and 3B, electrically conductive programming layers 6A and 6B are also formed at the drain and at the source, which are in each case separated or insulated from the charge storage layer 3A and 3B by a third insulating layer 4A and 4B (e.g. $SiO_2$).

Unlike the prior art, however, these drain side and source side programming layers 6A and 6B cannot now be controlled separately from the source region S and the drain region D but are electrically connected on the drain side and on the source side directly to one another via a respective interconnect layer 6AA and 6BB. This provides a split-gate storage element with reduced number of connecting contacts, particularly for the conventionally used programming electrodes PG, only one source line SL for connecting the source region S and the source side programming layer 6B to a programming electrode PG and one bitline BL for simultaneously connecting the drain region D and the drain side programming layer 6A via the drain side interconnect layer 6AA being formed now. The control electrode CG or word line WL is again used for connecting the control layer 5.

Accordingly, a source side charge carrier injection can still be implemented with much reduced space requirement for the integrated storage element, which results in advantageous or low operating voltages.

The materials used for the third insulating layers 4A and 4B are preferably oxide layers such as, e.g. $SiO_2$ which results in a so-called ONO (oxide/nitride/oxide) sequence of layers for the sequence of layers in the two second part-sections IIA and IIB, which exhibits excellent insulating properties due to its band structure.

In the same manner as the control layer 5, the programming layer 6A and 6B and the associated interconnect layer 6AA and 6BB can also exhibit heavily doped polysilicon which provides for particularly simple processing, and thus an inexpensive storage element, by using standard materials.

A fourth insulating layer 7 which again consists of silicon dioxide is preferably used for insulating the control layer 5 and the programming layers and interconnect layers and this fourth insulating layer can also be located as a drain side and source side fourth part insulating layer 7A and 7B in a recess close to the surface in at least the charge storage layers 3A and 3B which provides improved insulation of this charge storage layer, particularly with respect to the interconnect layers 6AA and 6BB. This recess close to the surface has been achieved by means of an isotropic etching before the insulating layer 7 was deposited.

However, these part insulating layers 7A and 7B can also be omitted, particularly when electrically insulating charge storage layers 3A and 3B are used, since the injected charge carriers are essentially inserted in the charge storage layer 3A and 3B at the transition of the part-sections I to IIA or IIB and there is essentially no migration of these charge carriers within the charge storage layer.

Accordingly, SSI split-gate storage elements are obtained which exhibit advantageous operating voltages with simplified structure and reduced space requirement.

FIGS. 6A to 6G show simplified sectional views for illustrating essential method steps in the production of the SSI split-gate storage element according to the invention, identical reference symbols again designating identical or corresponding layers or elements as in FIG. 5 and a repeated description being omitted in the text which follows.

Figure 6A:
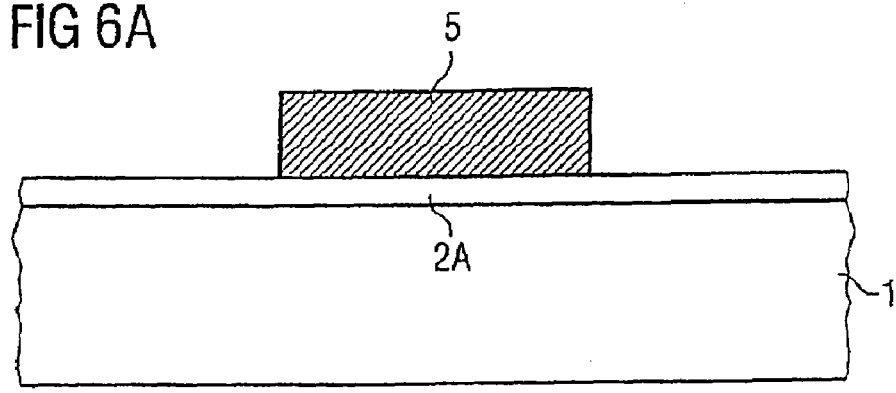
FIGS. 6A and 6G show simplified sectional views for illustrating essential method steps in the production of the dual-bit split-gate storage element according to the invention according to FIG. 5.

According to FIG. 6A, a semiconductor substrate 1 is first prepared, active regions being defined, for example, by means of trench isolations or corresponding well dopings being performed. On the surface of the semiconductor substrate 1, a first insulating layer 2A is first formed as the gate dielectric for the storage element, a silicon dioxide layer preferably being used as the gate oxide layer in the case of a silicon semiconductor substrate. Naturally, other semiconductor materials and other gate dielectrics can also be used for the semiconductor substrate 1 and the first insulating layer 2A.

Following this, an electrically conductive control layer 5 is formed on the surface of the first insulating layer 2A, for example by means of a deposition process, and patterned in such a manner that the sectional view shown in FIG. 6A is obtained. Preferably, a heavily doped polysilicon layer is deposited as the control layer 5 and patterned by means of a photolithographic method for forming a so-called gate.

Figure 6B:
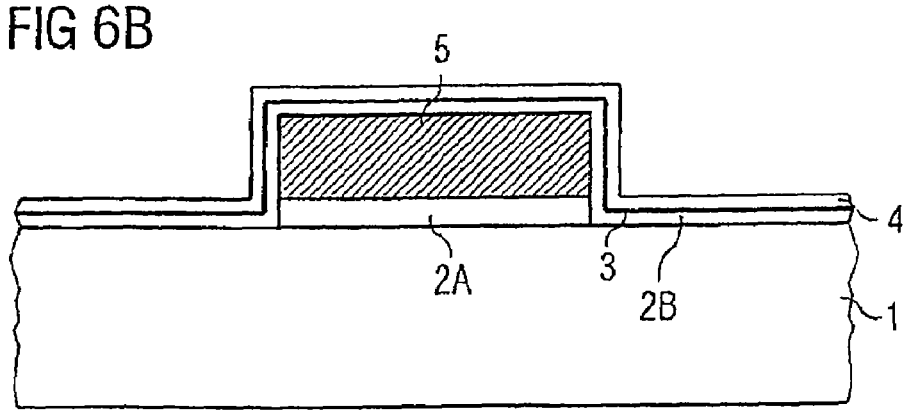

According to FIG. 6B, the first insulating layer 2A can also be patterned in a subsequent step or simultaneously with the patterning of the control layer 5, as a result of which only the first insulating layer 2A remains as gate dielectric below the control layer 5. However, this patterning can also be omitted.

Following this, a sequence of layers consisting of a second insulating layer 2B, a charge storage layer 3 and a third insulating layer 4 is formed on the surface of the semiconductor substrate 1 or, respectively, on the surface of the first insulating layer 2A and the patterned control layer 5, in which process an ONO (oxide/nitride/oxide) sequence of layers is preferably deposited over the whole area and the silicon nitride layer is used as the charge storage layer 3. As an alternative, another electrically insulating charge storage layer such as e.g. $ZrO_2$ or else an electrically conductive charge storage layer can also be deposited as the charge storage layer 3. A particularly advantageous sequence of layers which provides for high integration density with a simplified procedure is obtained, in particular, when the first insulating layer 2A is etched back and the ONO sequence of layers shown is formed.

Figure 6C:
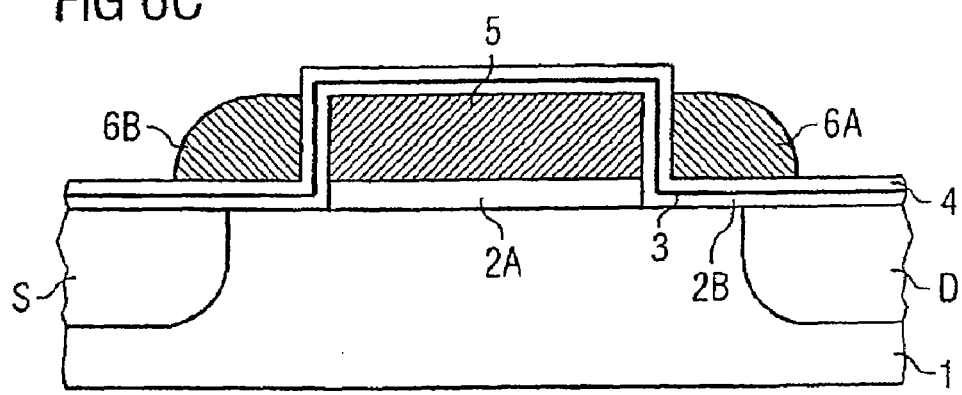

In a subsequent method step, according to FIG. 6C, a programming layer is initially deposited over the whole area and patterned in such a manner that programming layers 6A and 6B are obtained at the drain and at the source on the sidewalls of the patterned control layer 5 or of the corresponding ONO sequence of layers, respectively. During this process, a so-called spacer method is preferably used for forming the programming layers 6A and 6B, a second polysilicon layer first being deposited conformally, i.e. with the same thickness, as programming layer and then anisotropic etching back taking place, as a result of which the programming layers 6A and 6B are formed in the form of spacers on the sidewalls of the control layer 5.

Using these patterned programming layers or spacers 6A and 6B and the patterned control layer 5 with the sequence of layers of second insulating layer 2B, charge storage layer 3 and third insulating layer 4 lying above, source regions S and drain regions D are then formed in a self-aligning manner in the semiconductor substrate 1.

During this process, for example, an ion implantation is performed and a thermal posttreatment can be performed for diffusing out and activating the respective source and drain regions. An annealing process can also then be performed for reconstructing any crystal lattice which may have been disturbed.

Figure 6D:
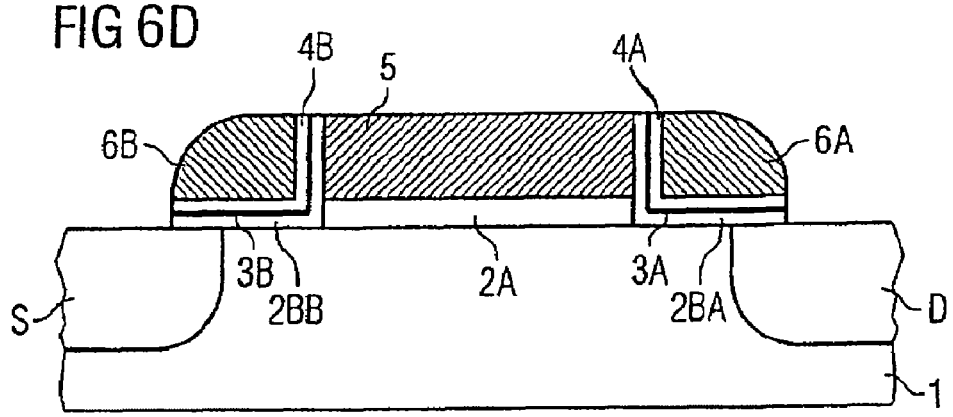

In a subsequent method step, according to FIG. 6D, the sequence of layers consisting of the third insulating layer 4, the charge storage layer 3 and the second insulating layer 2B is patterned, by using the spacers or patterned programming layers 6A and 6B, in such a manner that both the control layer 5 and the semiconductor substrate 1 or, respectively, the source and drain regions S and D are exposed. For this exposing of the source and drain regions, a so-called ONO dry etching method is preferably performed.

This provides a drain side and source side sequence of layers consisting of a drain side and source side second insulating layer 2BA and 2BB, a drain side and source side charge storage layer 3A and 3B and a drain side and source side third insulating layer 4A and 4B.

At this time, further etching back of at least the drain side and source side charge storage layer 3A and 3B can optionally be performed for forming at least recesses close to the surface below the patterned programming layers 6A and 6B, which, in particular, allows the insulation properties or leakage current properties to be improved considerably. In this process, a nitride etching method is preferably used.

Figure 6E:
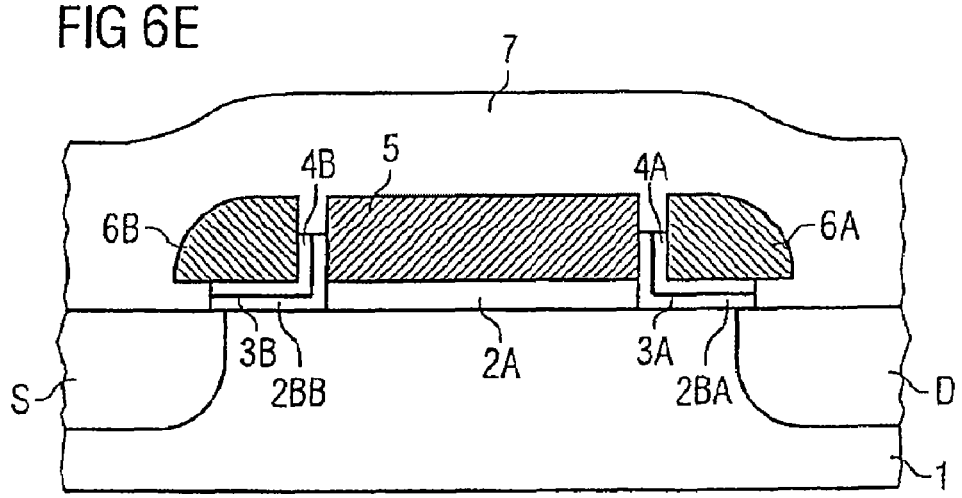

In a subsequent method step, according to FIG. 6E, a fourth insulating layer 7 is formed on the surface of the semiconductor substrate 1 and of the patterned programming layers 6A and 6B and the patterned control layer 5, during which the places etched back or, respectively, recesses generated in at least the charge storage layer in the optional backetching step are also filled up. To fill up the charge storage layer recesses formed optionally, for example, by an isotropic back etching method, a CVD oxide deposition is performed, for example.

Figure 6F:
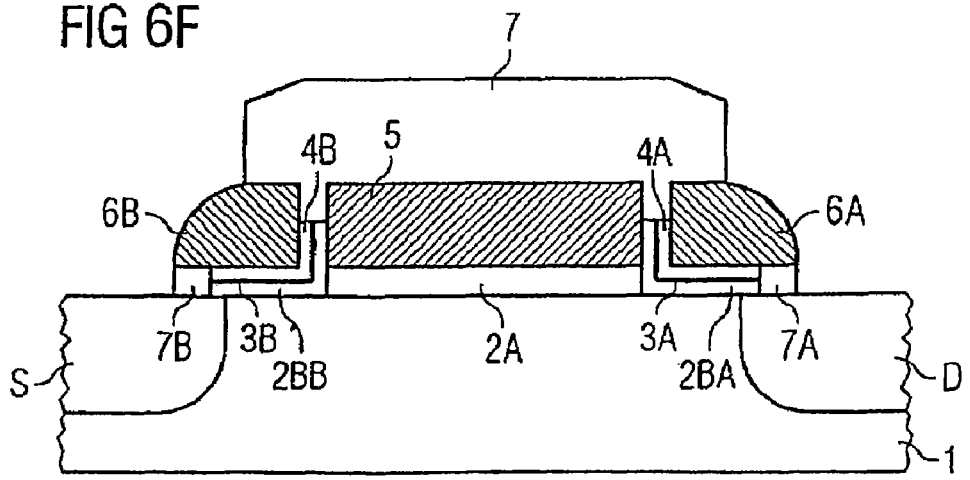

In a subsequent method step, according to FIG. 6F, the source region S and the drain region D are exposed, during which at least parts of the patterned drain side and source side programming layer 6A and 6B are also exposed for forming interconnect areas. During this process, a photolithographic method for forming contact openings or holes followed by anisotropic dry etching is preferably performed.

Figure 6G:
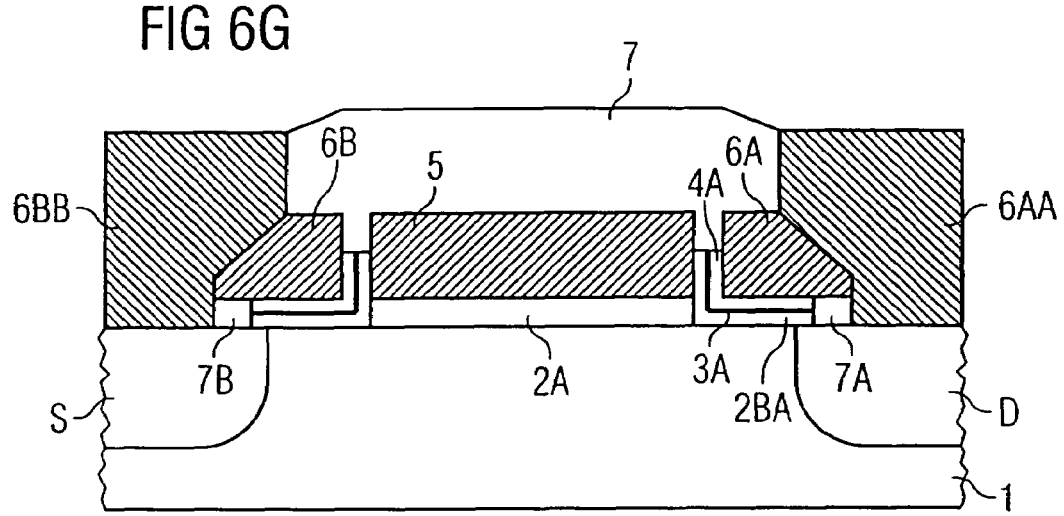

According to FIG. 6G, an electrically conductive interconnect layer is then formed in the exposed interconnect areas, such as e.g. contact openings, for contacting the drain side programming layer 6A and the drain region D and the source side programming layer 6B and the source region S. During this process, a third polysilicon layer is preferably deposited as the electrically conductive interconnect layer and planarized up to the fourth insulating layer 7, which results in a drain side interconnect layer 6AA and a source side interconnect layer 6BB. As the planarizing method, for example, a CMP (chemical mechanical polishing) method is performed which stops on the fourth insulating layer 7.

In this manner, an SSI split-gate storage cell with a small area requirement and simple structure can be formed by using standard methods.

In the text which follows, a control method or way of operating the split-gate storage element according to the invention is described, again with reference to FIG. 5, and only the conditions for writing, erasing or reading an information item or a state in the right-hand half are defined and writing, erasing or reading of a state can also be correspondingly performed in the left-hand side of the storage element when corresponding voltages are applied. Due to the symmetry of the storage element, the source region and the drain region are equivalent and correspondingly interchangeable.

To write an information item into a split-gate storage element or to programme the storage element by means of source side charge carrier injection (SSI), the potential at the source line SL or, respectively, the source region S and the source side programming layer 6B must be positive in order to be able to programme the state on the right-hand side of the storage element. More precisely, accordingly, a first positive write voltage is applied to the source side interconnect layer 6BB, a first write voltage of $V_{SL}=2$ V being applied, for example. The drain side voltage or, respectively, the voltage at the drain side programming layer 6A and the drain region D must be much higher than the first positive write voltage or, respectively, the voltage at the source region S and the source side programming layer 6B and have, for example, a voltage of $V_{PG}=6$ V as a second write voltage. A slightly higher third positive write voltage than the RMS threshold voltage of a respective inner transistor must then be applied to the control layer 5 for generating the SSI (source side injection) condition described above, a voltage of VCG=1.5 V, for example, being sufficient if the threshold voltage VT of an "inner" transistor of the storage element is equal to 1 V.

In this manner, a source side charge carrier injection can be performed in the drain side charge storage layer 3A in spite of a direct contact of the programming layers with the respective source and drain regions, the operating voltages being correspondingly low.

To erase an information item—again in the right-hand half of the split-gate storage element according to the invention— by comparison, a floating potential is applied to the source side interconnect layer 6BB whereas a high first erase voltage of, for example, $V_{PG}=8$ V is applied to the drain side interconnect layer 6AA, as a result of which hot holes are generated in the space charge zone of the drain region by means of an avalanche effect at the drain and are inserted into the drain side charge storage layer 3A. To improve an erasing process, a lower second erase voltage than the threshold voltage of a respective "inner" transistor can be applied to the control layer 5, a negative voltage preferably being used.

To read an information item in a right-hand half of the split-gate storage element, a first positive read voltage of, for example, $V_{SL}=3$ V is applied to the source side interconnect layer 6BB whereas a second read voltage which is sufficiently smaller than the first read voltage and is e.g. $V_{PG}=0$ V is applied to the drain side interconnect layer 6AA. To generate a preferably reverse readout condition, a third read voltage in the region of the first read voltage of, for example, $V_{CG}=2$ to 5 V is applied to the control layer 5. With regard to the reverse readout condition, it should be pointed out that source and drain are interchanged and the charge now captured at the source, i.e. at the drain in FIG. 5, has a greater influence on the read current than the charge captured at the drain, i.e. at the source in FIG. 5. Although this charge is covered by the positive drain voltage, it has an insignificant influence on the resultant read current, which is why states can still be read out sufficiently accurately in the storage element according to the invention with the source regions and drain regions with a short-circuited interconnect layer. More precisely, an associated channel section is depleted, and requires a high impedance, with a negatively charged charge storage layer 3A or 3B, respectively, which results in a reduced read current, on the one hand. On the other hand, an associated channel section requires a low impedance with a positively charged charge storage layer (holes), which results in an increased read current.

The invention has been described above by means of a dual-bit split-gate storage element for storing two states. However, it is not restricted to this and can also exhibit nonvolatile semiconductor storage elements with only one storage state in the same manner. Furthermore, doped polysilicon layers were described as materials for the electrically conductive layers but alternative materials and, in particular, metallic materials can also be used. In the same manner, alternative materials can also be used for the insulating layers and for the semiconductor substrate.

LIST OF REFERENCE SYMBOLS

1 Semiconductor substrate
2, 2A First insulating layer
3, 3A, 3B Charge storage layer
2B, 2BA, 2BB Second insulating layer
4, 4A, 4B Third insulating layer
5 Control layer
6A, 6B Programming layer
7, 7A, 7B Fourth insulating layer
6AA, 6BB Interconnect layer
S Source region
D Drain region
I First part section
II, IIA, IIB Second part section
SL Source line
CG Control electrode
PG Programming electrode
WL Word line
BL Bitline

The invention claimed is:

1. A nonvolatile semiconductor storage element comprising:
   a semiconductor substrate having a source region, a drain region and an intermediate channel region;
   a control layer on a first portion of the channel region and insulated therefrom by a first insulating layer;
   a charge storage layer on a second portion of the channel region and insulated therefrom by a second insulating layer,
   wherein the second portion of the channel region has a source side adjacent to the source region and a drain side adjacent to the drain region, and
   wherein the charge storage layer has a source side charge storage layer and a drain side charge storage layer;
   a programming layer on the charge storage layer and insulated therefrom by a third insulating layer, wherein the programming layer has a source side programming layer and a drain side programming layer;
   a first interconnect layer electrically connecting the source side programming layer to the source region; and
   a second interconnect layer electrically connecting the drain side programming layer to the drain region.

2. The nonvolatile semiconductor storage element according to claim 1, wherein the charge storage layer comprises an electrically nonconductive layer.

3. The nonvolatile semiconductor storage element according to claim 1, wherein the first and second insulating layers comprise $SiO_2$.

4. The nonvolatile semiconductor storage element according to claim 1, wherein the charge storage layer comprises one of an $Si_3N_4$, $HFO_2$ or $ZrO_2$ layer.

5. The nonvolatile semiconductor storage element according claim 1 wherein the control layer, the programming layer, and the interconnect layer comprise doped polysilicon.

6. A method for producing a nonvolatile semiconductor storage element comprising the steps of:
   a) preparing a semiconductor substrate having a surface;
   b) forming a first insulating layer on the surface of the semiconductor substrate;
   c) forming and patterning a control layer on the surface of the first insulating layer;
   d) forming a sequence of layers including a second insulating layer, a charge storage layer, and a third insulating layer on the surface of the semiconductor substrate and the patterned control layer;
   e) forming and patterning a programming layer on the third insulating layer and on the side walls of the control layer;
   f) forming source regions and drain regions in the semiconductor substrate using the programming layer and the patterned control layer as a mask;
   g) patterning the third insulating layer, the charge storage layer, and the second insulating layer using the programming layer as a mask;
   h) forming a fourth insulating layer on the surface of the semiconductor substrate, the patterned programming layer and the patterned control layer;
   i) exposing first and second interconnect areas in at least portions of the patterned programming layer, the source region, and the drain region; and
   j) forming a first electrically conductive interconnect layer in the first interconnect area that contacts the programming layer overlying the source region and forming a second electrically conductive interconnect layer in the second interconnect area that contacts the programming layer overlying the drain region.

7. The method according to claim 6, wherein forming the first insulating layer comprises forming a gate dielectric layer.

8. The method according to claim 6, wherein forming a control layer comprises forming a first polysilicon layer.

9. The method according to claim 6, wherein forming a sequence of layers comprises forming an oxide layer, a nitrile layer, and an oxide layer.

10. The method according to claim 6, wherein depositing and patterning a programming layer comprises depositing a polysilicon layer and patterning the polysilicon layer to form sidewall spacers on the control layer.

11. The method according to claim 6, wherein forming source regions and drain regions comprises ion implantation and a thermal post-treatment for diffusing-out and activating the source and drain regions.

12. The method according to claim 6, further comprising anisotropically dry etching the sequence of layers and isotropically etching-back of at least the charge storage layer to form charge storage layer recesses.

13. The method according to claim 12, wherein forming a fourth insulating layer comprises depositing an oxide to fill the charge storage layer recesses.

14. The method according to of claim 6, wherein forming first and second electrically conductive interconnect layers comprises depositing and planarizing a third polysilicon layer.

15. A method for writing an information item into a nonvolatile semiconductor storage element configured according to claim 1, comprising the following steps:
   a) applying a first positive write voltage to the first interconnect layer;

b) applying a second positive write voltage, which is much higher than the first positive write voltage, to the second interconnect layer; and c) applying a third positive write voltage, which is slightly higher than an RMS threshold voltage of a respective inner transistor, to the control layer for generating an SSI condition.

16. A method for erasing an information item in a nonvolatile semiconductor storage element configured according to claim 1, comprising the steps of:

a) applying a floating potential to the first interconnect layer;

b) applying a high first erase voltage to the second interconnect layer; and c) applying a second erase voltage, which is lower than an RMS threshold voltage of a respective inner transistor, to the control layer for generating an avalanche effect condition.

17. A method for reading an information item in a nonvolatile semiconductor storage element configured according to claim 1, comprising the steps of:

a) applying a first positive read voltage to the first interconnect layer;

b) applying a second read voltage, which is sufficiently smaller than the first read voltage, to the second interconnect layer; and c) applying a third read voltage, which has a magnitude similar to the first read voltage, to the control layer for generating a reverse readout.

18. The nonvolatile semiconductor storage element according claim 1 further comprising a source line contact to the first interconnect layer, such that the source line is electrically connected to both the source region and the source side programming layer.

19. The nonvolatile semiconductor storage element according claim 1 further comprising a bit line contact to the second interconnect layer, such that the bit line is electrically connected to both the drain region and the drain side programming layer.

* * * * *